United States Patent [19]

Reher

[11] Patent Number: 5,321,627
[45] Date of Patent: Jun. 14, 1994

[54] BATTERY MONITOR AND METHOD FOR PROVIDING OPERATING PARAMETERS

[75] Inventor: Michael T. Reher, Milwaukee, Wis.

[73] Assignee: Globe-Union, Inc., Milwaukee, Wis.

[21] Appl. No.: 850,405

[22] Filed: Mar. 11, 1992

[51] Int. Cl.$^5$ .................... G01R 31/36; H01M 10/48
[52] U.S. Cl. .................... 364/483; 364/557; 324/427; 324/431; 340/636; 320/43; 320/48
[58] Field of Search .................... 364/550, 551.01, 481, 364/483, 557; 324/426, 427, 428, 431; 340/636; 320/48, 43

[56] References Cited

U.S. PATENT DOCUMENTS

| | | | |
|---|---|---|---|
| 3,906,329 | 9/1975 | Bader | 324/428 |
| 3,936,718 | 2/1976 | Melling et al. | 320/20 |
| 4,390,841 | 6/1983 | Martin et al. | 324/427 |
| 4,558,281 | 12/1985 | Codd et al. | 324/427 |
| 4,595,880 | 6/1986 | Patil | 324/427 |
| 4,876,513 | 10/1989 | Brilmyer et al. | 324/427 |
| 4,888,716 | 12/1989 | Ueno | 364/550 |
| 4,947,123 | 8/1990 | Minezawa | 324/427 |
| 4,949,046 | 8/1990 | Seyfang | 324/427 |
| 4,968,942 | 11/1990 | Palanisamy | 324/427 |
| 5,047,961 | 9/1991 | Simonsen | 364/550 |
| 5,218,288 | 6/1993 | Mickal et al. | 320/48 |

FOREIGN PATENT DOCUMENTS

| | | |
|---|---|---|
| 0420530 | 9/1990 | European Pat. Off. . |
| 0505333 | 3/1992 | European Pat. Off. . |
| 89/01169 | 2/1989 | World Int. Prop. O. . |
| 90/13823 | 11/1990 | World Int. Prop. O. . |
| 91/08494 | 6/1991 | World Int. Prop. O. . |

*Primary Examiner*—Thomas G. Black
*Assistant Examiner*—Michael Zanelli
*Attorney, Agent, or Firm*—Foley & Lardner

[57] ABSTRACT

A battery monitor which monitors the operating parameters of a battery to provide an indication of, for example, the absolute state of charge, the relative state of charge, and the capacity of the battery under battery discharge, rest, and recharge conditions. The battery monitor includes a current sensor for sensing battery current, a voltage sensor for sensing battery voltage, and a temperature sensor for sensing battery temperature. A processor approximates to a high level of accuracy the battery parameters utilizing an iterative process based upon predetermined relationships, employing empirically determined constants and parameters determined in the immediately proceeding iteration stored in memory. Output signals indicative of the determined parameters are provided and may be utilized for many different battery applications.

139 Claims, 5 Drawing Sheets

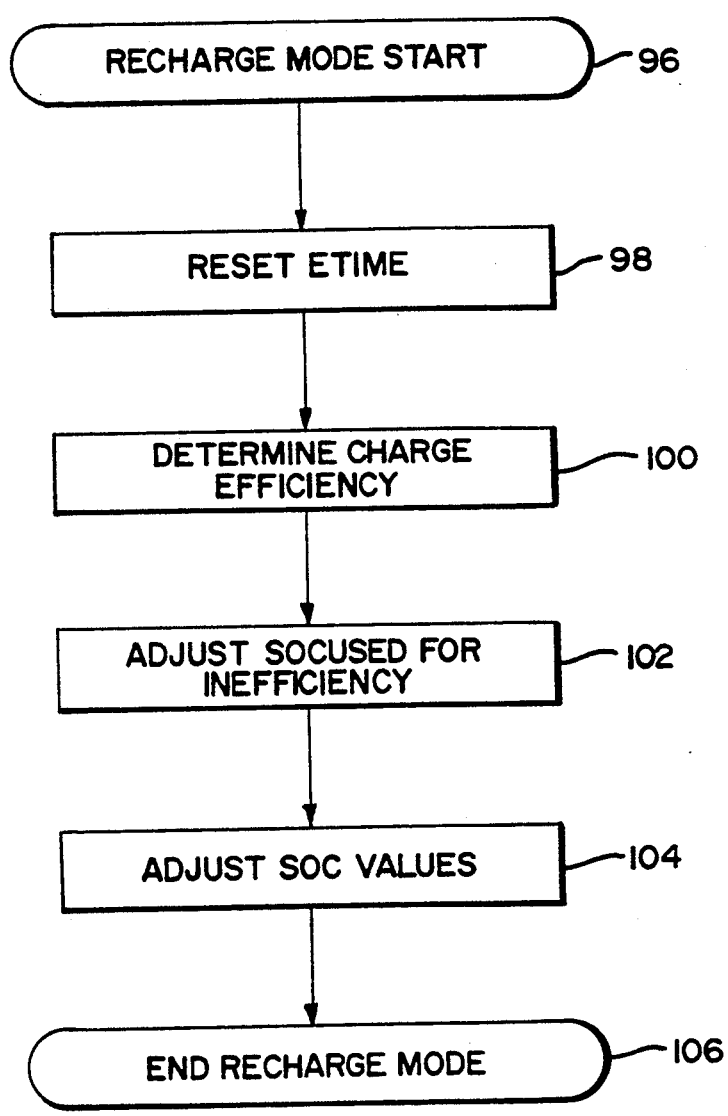

BATTERY MONITOR AND METHOD FOR PROVIDING OPERATING PARAMETERS

BACKGROUND OF THE INVENTION

The present invention is generally directed to a battery monitor and method for monitoring the operating parameters of a battery such as a lead-acid battery. The present invention is more particularly directed to a battery monitor and method for monitoring the operating parameters of a battery and providing output signals indicative of the operating parameters such as the capacity of the battery, the relative state of charge of the battery, or the absolute state of charge of the battery independent of whether the battery is in discharge, recharge, or at rest. The battery monitor, at spaced apart time intervals, estimates the operating parameters to a high degree of accuracy based upon predetermined relationships of measured battery current, measured battery voltage, measured battery temperature, empirically determined constants, and previously determined operating parameters or measured values.

Lead-acid storage batteries have become highly refined since these devices were first utilized commercially about 125 years ago. Since its introduction, the lead-acid storage battery has distinguished itself as a highly efficient and reliable electrochemical energy source. In addition to being a highly efficient energy source, lead-acid storage batteries are also relatively insensitive to debilitating temperature effects over a broad temperature range of, for example, $-40°$ to about $160°$ F. As a result, lead-acid storage batteries lend themselves to a broad range of utilities which continues to increase.

Transportation is one example of a commercial use for lead-acid storage batteries. Such batteries have been used for small or personal vehicle movement for quite some time. For example, such batteries have been used effectively for golf carts, wheelchairs, trolling motors or similarly small-scaled transportation devices. There has also been great interest recently in the adaptability of such storage batteries for providing power to larger vehicles such as, the so-called "electric car." Such vehicles rely heavily upon the regenerative ability of lead-acid storage batteries to provide adequate power for transportation over reasonable distances, as for example, 50 miles, without the need for recharging. For such applications, it is of obvious importance to the user that a destination be reached prior to the need to recharge or replace the batteries. Currently, because of the rarity of electric vehicles for general transportation, facilities do not exist as a general matter for recharging such batteries and hence, travel must be carefully scheduled and monitored. In turn, there is a compelling need for monitoring the state of charge of the battery or batteries to provide an accompanying fuel gauge like indication of the amount of energy remaining in the battery or batteries for continued travel.

There have been a number of proposals, in the prior art, for providing such monitoring of batteries, such as a lead-acid storage battery. For example, one arrangement examines the condition of a storage battery used as a starting, lighting and ignition battery for an internal combustion engine. This arrangement measures battery voltage under opened circuit conditions and while the battery is subjected to a predetermined AC load and a predetermined DC load. The temperature of the battery is also monitored. A microprocessor utilizes the opened circuit potential, the measured potential under both DC and AC loading, and the temperature to ascertain the characteristics of the battery. For example, internal resistance is determined and, should it be found to be excessive, the battery is deemed defective. Open circuit voltage, internal resistance and temperature provide inputs for calculating the estimated power at a fully charged state. The apparatus then discharges the battery through a reference load for about 15 seconds at constant load and measures a 15 second battery voltage. This voltage is then compared to a similar voltage of a battery at about 75% state of charge under the same conditions. If the voltage measured is higher than value maintained in a computer, the battery condition is deemed good. As a result, performance benchmarks are ascertained with a view toward determining battery capability.

Another arrangement concerns an apparatus for determining the general state of charge of a battery. This approach, however, requires the battery to be taken off-line from its circuit and connected to a calibrated resistor to determine state of charge. The process requires the battery to be subjected to two loads, one corresponding to a minimum current consumption level or load and the other a maximum consumption level or load. The process includes monitoring the load condition between the minimum and maximum load possibilities, periodically connecting the battery to a reference load when the minimum load is applied to the battery sampling the voltage across the reference load and comparing the sample voltage to an array of predetermined levels, each corresponding to a different state of charge. The comparison thereby yields an indication of the present condition of the battery.

A further arrangement determines state of charge of a battery based upon the integration of current. During the first portion of the discharge, the state of charge is evaluated by integrating the current after compensating for the rate of discharge. Later in the discharge, the state of charge of the battery is determined from the lowest subpack voltage corrected for polarization. Battery polarization is used to calculate a corrected battery voltage which is used to terminate discharge at an appropriate time.

A more improved battery monitor is shown and described in U.S. Patent No. 4,876,513 which is assigned to the Assignee of the present invention. This monitor is a dynamic state of charge indicator for a storage battery characterized by a discharge curve relating available energy of the battery to a contemporaneous voltage over a range of voltage boundaries having predetermined end points corresponding to fully charged and effectively discharged for one charge cycle. The indicator includes a microprocessor which stores predetermined relationships between the contemporaneous voltage and the state of charge of the battery. A voltage sensor and a current sensor are connected to monitor battery voltage and current flow and to provide corresponding voltage and current signals to the microprocessor. The microprocessor periodically computes the internal resistance of the battery, the average voltage and current for a predetermined discharge time period and a corrected voltage as a total of internal resistance voltage loss and average voltage with the state of charge being determined as a function of corrected battery voltage.

While the last mentioned battery monitor provided a distinct advancement in the art, there still remains a need in the art for a more effective battery monitor. For example, there is a need in the art for a battery monitor which is capable of providing indications of battery state of charge whether the battery is in discharge, recharge, or at rest. The aforementioned battery monitor disclosed in U.S. Pat. No. 4,876,513, because it relies upon a measurement of internal battery resistance, requires that the battery be in discharge. As a result, the state of charge of the battery can only be determined when the battery is in discharge. Also, because the internal resistance measurement requires a fluctuating current, such measurements are subject to inaccuracies.

SUMMARY OF THE INVENTION

The present invention provides a battery monitor for monitoring operating parameters of a battery and includes voltage sensor means for sensing battery voltage and providing a voltage sensor signal indicative of the battery voltage, current sensor means for sensing battery current and providing a current sensor signal indicative of the battery current, and processing means for reading the voltage sensor signal, for reading the current sensor signal, and for computing the operating parameters at spaced apart computing times. The battery monitor further includes memory means coupled to the processing means for storing selected ones of the last computed operating parameters and output means for providing output signals indicative of the predetermined ones of the operating parameters. The processing means computes the operating parameters at each of the spaced apart computing times responsive to the current sensor signal, the voltage sensor signal, and the stored selected ones of the last computed operating parameters.

The present invention further provides a method for monitoring the operating parameters of a battery including the steps of providing a voltage sensor, sensing battery voltage and providing a voltage sensor signal indicative of the battery voltage, providing a current sensor, and sensing battery current and providing a current sensor signal indicative of the battery current. The method further includes the steps of providing processing means for reading the voltage sensor signal, for reading the current sensor signal, and for computing the operating parameters at spaced apart computing times, providing memory means coupled to the processing means, storing selected ones of the last computed operating parameters in the memory means, and causing the processing means to compute the operating parameters at each of spaced apart computing times responsive to the current sensor signal, the voltage sensor signal, and the stored selected ones of the last computed operating parameters. The method lastly includes providing output signals indicative of predetermined ones of the operating parameters.

The present invention further provides a battery monitor for use with a battery, the battery monitor including processing means, voltage sensor means for sensing battery voltage and providing a voltage sensor signal to the processing means, and current sensing means for sensing battery current and providing a current sensor signal to the processing means. The processing means computes the rated capacity of the battery, the current capacity of the battery, the state of charge used by the battery, a factor of the battery, the absolute state of charge of the battery, and the relative state of charge of the battery. The battery monitor further includes output means for providing output signals including a signal indicative of the absolute state of charge of the battery.

The present invention still further provides a method of monitoring the absolute state of charge of a battery including the steps of providing processing means, providing voltage sensor means, sensing the voltage of the battery and providing a voltage sensor signal to the processing means, and providing current sensor means. The method further includes the steps of sensing the battery current and providing a current sensor signal to the processing means, causing the processing means to compute the rated capacity of the battery, the current capacity of the battery, the state of charge used by the battery, a factor of the battery, the absolute state of charge of the battery, and a relative state of charge of the battery, and providing an output signal indicative of the absolute state of charge of the battery.

BRIEF DESCRIPTION OF THE DRAWINGS

The features of the present invention, which are believed to be novel, are set forth with particularity in the appended claims. The invention, together with further objects and advantages thereof, may best be understood by making reference to the following description taken in conjunction with the accompanying drawings, in the several figures of which like reference numerals identify identical elements, and wherein:

FIG. 5 is a flow diagram illustrating the manner in which the battery monitor of FIG. 1 may be implemented for monitoring a battery under recharge in accordance with the present invention.

DETAILED DESCRIPTION

Figure 1:
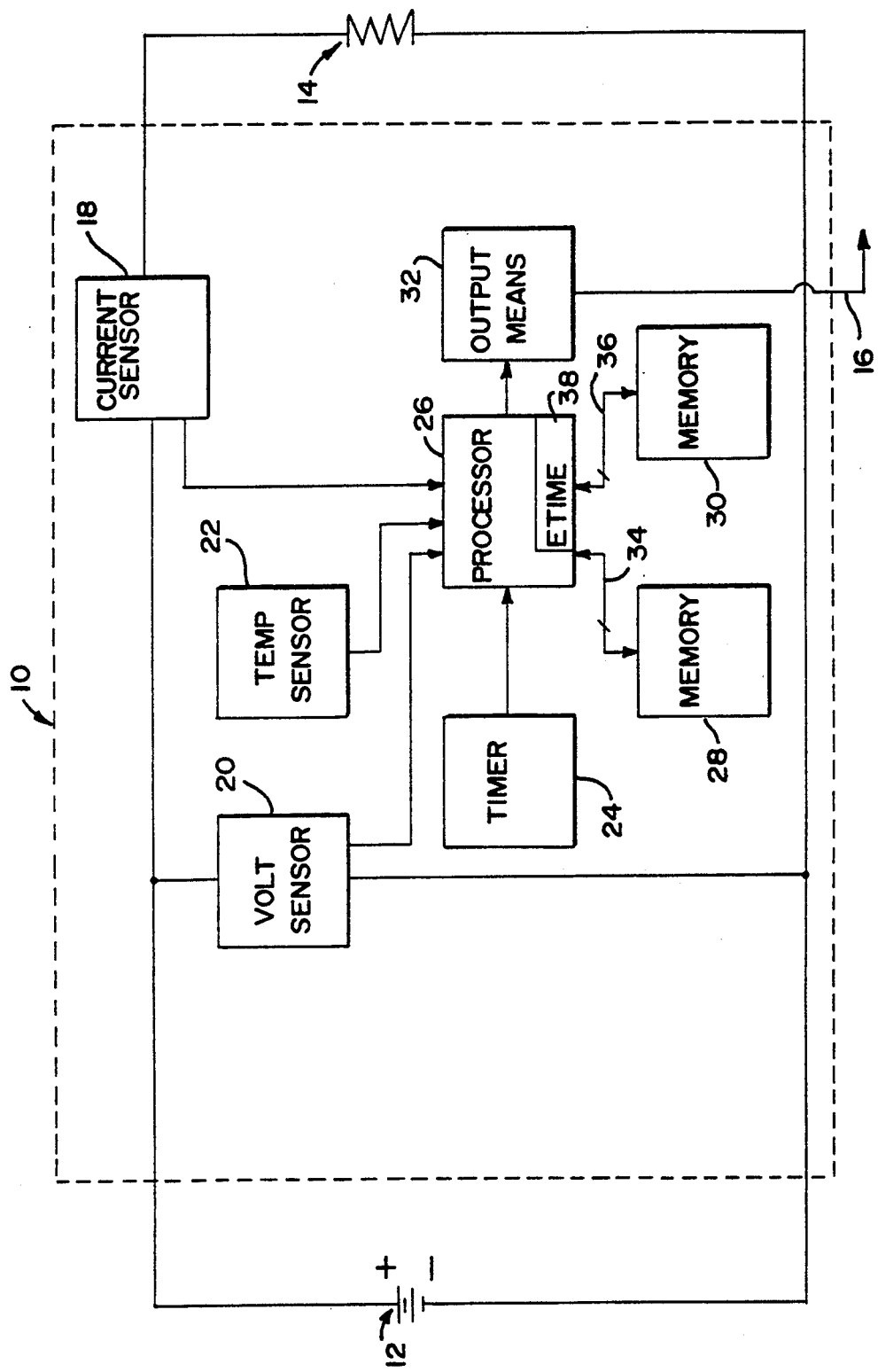
FIG. 1 is a schematic block diagram illustrating the principal components of a battery monitor in accordance with the present invention.

Referring now to FIG. 1, it illustrates, in block diagram form, a battery monitor 10 embodying the present invention. The battery monitor 10 is associated with a battery 12 such as a lead-acid battery and a load 14, which may be a varying load, such as the lighting, heating, operating, and starting systems of an automobile, for example. The battery monitor 10 as will be seen hereinafter, at spaced apart time intervals, measures the current, voltage, and temperature of the battery 12, and responsive to these measured quantities, provides output signals at an output 16 indicative of the operating characteristics of the battery 12. The output signals may, for example, be indicative of the relative state of charge of the battery which is the percentage of battery capacity immediately available at a specified discharge rate, such as, the 20 hour rate. The output signals may also provide a signal indicative of the absolute state of charge of the battery which is the percentage of battery capacity the battery has if allowed to recuperate from recent usage. The absolute state of charge of the battery may also be based upon the 20 hour discharge rate. The output signals provided at output 16 may also be indicative of the output battery capacity which is the amount of amp-hours that the fully charged battery has if discharged at a specified discharge rate, such as, the 20 hour rate. The output signals may further be indicative of the output battery capacity remaining which is the remaining amount of amp-hours the battery has if it is continued to be discharged at a specified discharge rate, such as, the 20 hour rate. The output signals may further be indicative of the output time to empty of the battery which is the time remaining until the battery reaches a specified output voltage, such as, 10.5 volts, if discharged at a specified discharge rate, such as the present current level. A still further output signal may be indicative of the amp-hours required to fully recharge the battery. Other output signals may be indicative of the "time to full" which is the time required to fully recharge the battery if the battery is to be recharged at a specified rate, such as the present charging current level. A still further output signal may be indicative of the recommended recharge voltage, which is the voltage setting which will maximize the recharging time of the battery, while minimizing the debilitating effects of recharging. A still further output signal may be indicative of the critical restart temperature which represents the lowest temperature in which the battery will successfully supply enough energy to start an engine given the present battery condition.

The battery monitor 10 generally includes a current sensor 18, a voltage sensor 20, and a temperature sensor 22. The battery monitor 10 further includes a timing means or timer 24, a processor 26, a first memory 28, a second memory 30, and an output means 32 which provides the output signals at output 16.

The current sensor 18 is coupled in series between the battery 12 and the load 14 for sensing the current drawn from the battery 12 and may be of the form well known in the art for sensing the current within a circuit. The voltage sensor 20 is coupled across the battery 12 for sensing the output voltage of battery 12 and may be of a form well known in the art for sensing the voltage of a power source. The temperature sensor 22 may be of the form well known in the art for sensing the temperature of the battery. Alternatively, for those applications where the temperature of the battery is to be maintained at a known constant level, the temperature sensor 22 may be omitted and a fixed temperature utilized for generating the output signals indicative of the operating parameters of the battery. The current sensor 18, the voltage sensor 20, and temperature sensor 22 are all coupled to the processor 26 for providing the processor 26 with current sensor signals, voltage sensor signals, and temperature sensor signals respectively.

The timer 24 is coupled to the processor 26 to initiate computing times and to cause the processor, at spaced apart time intervals, to read the voltage sensor signal, the temperature sensor signal, and the current sensor signal for providing the output means 32 with intermediate control signals indicative of the output parameters. The intermediate control signals may be multiple bit binary words which are converted to analog signals by a digital to analog converter (not shown) of the output means 32, for example. Although the timer 24 is shown external to the processor 26, as well known in the art, the timer 24 may be included within the processor 26 without departing from the present invention. Alternatively, the battery monitor may initiate computing times through a different mechanism. For example, the processor may initiate the computing time at the completion of one iteration. In these cases, the timer 24 would be coupled to the processor 26 to indicate the time elapsed between consecutive iterations, as in this example, the timer 24 would indicate the time it took to complete the last iteration.

The processor 26 includes another timer 38. This timer 38 maintains the elapsed time (etime) in which the battery 12 is at rest. The timer 38, as will be seen hereinafter, is reset by the processor 26 when the battery is in either discharge or recharge, and hence not at rest.

The processor 26 may take different forms. For example, the processor 26 may be a digital signal processor, a microprocessor, a microcontroller, or, a general purpose computer. The processor 26 is coupled to the first memory 28. The processor 26 obtains operating instructions from the first memory 28 which may be a read-only memory to control its executions for generating the intermediate control signals indicative of the operating parameters of the battery 12 in a manner to be described hereinafter. The first memory 28 is coupled to the processor 26 by a multiple-bit bus 34 for providing the operating instructions to the processor 26.

The second memory 30, which may be a random access memory, is coupled to the processor 26 by a multiple-bit bidirectional bus 36. The battery monitor 10, in accordance with the present invention, utilizes iterative processing for determining the operating parameters of the battery. The second memory 30 is utilized for storing selected ones of the operating parameters last computed by the processor 26 during the last iteration which are utilized by the processor 26 for determining the operating parameters of the battery 12 during the next iteration. In addition, the second memory 30 may also be utilized by the processor 26 for storing measured values such as the current of the battery measured during the immediately preceding iteration. Each such measured value or operating parameter stored in the second memory 30 will therefore be referred to hereinafter as the last corresponding measured value or computed parameter. For example, in implementing the battery monitor 10, during each iteration, the microprocessor stores the newly calculated capacity of the battery, the integrated amp-hour state of charge of the battery, the absolute state of charge of the battery, a factor to be described hereinafter, and the current of the battery. The previously referred to factor, as will be seen hereinafter, is the difference between the absolute state of charge of the battery and the relative state of charge of the battery.

As will be seen hereinafter, the relationships implemented by the processor 26 between the sensed current, sensed voltage, and sensed temperature of the battery provide a very accurate approximation of the operating parameters of the battery 12 under all conditions including discharge, rest, and recharge of the battery. These relationships require the use of a number of empirically determined constants. These constants, and the manner of empirically deriving the same, are discussed immediately hereinafter.

Constant "a" is the best estimate of initial battery capacity. This constant is determined at a given discharge current rate (m) for a large number of batteries of the type to be monitored.

Constant "b" is the best estimate of the initial battery state of charge This constant is determined from a large number of batteries of the type to be monitored.

Constant "c" is the maximum current magnitude expected when the battery is at rest. This constant is determined by measuring the current magnitude of a large number of batteries of the type to be monitored when at rest and under loads typical of the application of the battery to be monitored.

Constant "d" is the current increment used to make values dimensionless. The value of this constant may be, for example, 1 ampere.

Constant "e" is the minimum current magnitude that supports an accurate determination of the relative state of charge of the battery. This constant is determined by comparing the relative state of charge determined by the relative state of charge relationship to be described hereinafter with actual state of charge data to determine the minimum current magnitude that will support the relative state of charge determination to maintain sufficient accuracy.

Constant "h" is a value used to determine if the open circuit voltage state of charge of the battery determined while the battery is at rest is close enough to the actual state of charge to be used. The value of this constant is selected to correspond to the average state of charge error goal which represents the expected cumulative average error in determining the battery state of charge.

Constant "j" is a voltage increment used to make values dimensionless. This value may be, for example, 1 volt.

Constant "k" is the temperature increment used to make values dimensionless. This value may be, for example, 1° F.

Constant "l" is the time increment used to make values dimensionless. This value may be, for example, 1 hour.

Constant "m" is the battery current level upon which the rated capacity of the battery is based. This is also the current magnitude used to determine the initial battery capacity (a).

Constant "t" is the time required to safely allow the battery voltage to settle after its last use. This constant is determined by noting voltage recovery rates of the battery type to be monitored at various state of charge levels and temperatures and selecting a value which corresponds to the average state of charge error goal.

Constant "u" is the change in state of charge required to safely adjust the determined capacity value of the battery. This constant is selected to be slightly greater than the average state of charge error goal.

Constant "v" is a weighting factor used for adjusting the determined capacity value of the battery during rest periods. This constant is determined by selecting a value which allows the determined capacity value of the battery to change at a rate slightly faster than the actual rate in which the capacity of the batter to be monitored changes during its lifetime.

Constant "w" is the time required to partially allow the voltage of the battery to settle after its last usage. This constant is determined by noting voltage recovery rates of the battery type to be monitored at various state of charge levels and temperatures and selecting a value which corresponds to the maximum state of charge error goal.

Constant "y" is a weighting factor used for adjusting the determined capacity value of the battery during battery discharge. This constant is determined by selecting a value which allows the determined capacity value of the battery to change at a rate slightly faster than the actual rate in which the capacity of the battery to be monitored changes during its lifetime.

Constant "z" is the maximum battery capacity expected for the battery to be monitored. This constant is determined by sampling a large number of batteries of the type to be monitored for the maximum battery capacity value possible for that type of battery.

Constants "aa", "ab", "ac", "ad", "ae", and "af" are empirical constants utilized in the battery capacity relationship. These constants are determined by testing a large number of batteries of the type to be monitored for capacity at various temperature levels and discharge current levels. The values of these constants are selected such that the capacity relationship accurately predicts battery capacity at a given temperature and discharge current.

Constants "ba", "bb", "bc", and "bd" are empirical constants for the charge efficiency relationship to be described hereinafter. These constants are determined by testing a large number of batteries of the type to be monitored in a fully charged condition for steady state recharge current at various voltage levels and temperature levels. These constants are selected such that the charge efficiency relationship accurately predicts steady state recharge current at a given temperature and recharge voltage.

Constants "ca" and "cb" are band limits for adjusting the absolute state of charge of the battery during discharge. These constants are determined by selecting values such that noise experienced in monitoring the battery is sufficiently filtered. Values for ca will always be less than one while values for cb will always be greater than one. Values of one represent maximum filtering.

Constants "da", "db", "dc", "dd", "de", "df", "dg", "ga", and "gb" are empirical constants for the open circuit voltage state of charge relationship to be described hereinafter. These constants are determined by testing a large number of batteries of the type to be monitored for voltage at various state of charge levels, current levels, and temperature levels and collecting battery state of charge, voltage, temperature, and current data. These constants are selected such that the open circuit voltage state of charge relationship accurately predicts battery state of charge at a given voltage, temperature, and current.

Constants "ea", "eb", "ec", "ed", "ee", "fa", and "fb" are empirical constants for the relative state of charge relationship to be described hereinafter. These constants are determined by completely discharging a large number of batteries of the type to be monitored from a fully charged condition at various constant current levels and temperature levels and collecting battery voltage, current, and temperature data. For each discharge, the battery state of charge should be determined utilizing an amp-hour integration method, of the type well known in art after determining battery capacity for that test. The values of these constants should be selected such that the relative state of charge equation accurately predicts battery state of charge at a given voltage, temperature, and current.

Constants "ha", "hb", "hc", "hd", "he", and "hf" are empirical constants for the recharge voltage relationship to be described hereinafter. These constants are determined by completely recharging a large number of batteries of the type to be monitored from a fully discharged condition at various constant current levels and temperature levels and collecting battery voltage, current, and temperature data. For each recharge, the battery state of charge utilizing an amp-hour integration method, of the type well known in the art, is determined after correcting for charge efficiency and determining battery capacity for each test. The values of these constants are selected such that the recharge voltage relationship maximizes recharge current rate and minimizes charge inefficiency at high state of charge levels.

Constants "ja", "jb", "jc", "jd", "je", and "jf" are empirical constants for the restart prediction relationship to be described hereinafter. These constants are determined by testing a large number of batteries of the type to be monitored for successful starting at various temperature, capacity, and state of charge levels within the applications the battery is expected to be used in. The values of these constants are selected such that the restart prediction relationship accurately predicts the lowest temperature which resulted in successful starting at a given state of charge level and battery capacity.

Constants "xa" and "xb" are weighting factors used for adjusting the absolute state of charge value when the battery to be monitored is at rest. These constants are determined by noting voltage recovery rates at various state of charge levels and temperatures and selecting values which allow the absolute state of charge to change slightly faster than the average voltage recovery rate.

The following is a list containing typical values for the constants described above for a 58/540 Motorcraft battery manufactured by Globe-Union, Inc., the assignee of the present invention.

| | |
|---|---|
| a = 60.0 amp-hours | cb = 1.5 |
| b = 1.0 | da = 11.6 volts |
| c = 0.06 amps | db = 1.5e7 volts |
| d = 1.0 amps | dc = 105.84° F. |
| e = 1.0 amps | dd = 1.0 |
| h = 0.01 | de = 3.0 |
| j = 1.0 volts | df = −8.87e-4 volts/°F. |
| k = 1.0° F. | dg = −70.0° F. |
| l = 1.0 hour | ea = 10.5 volts |
| m = 2.9 amps | eb = 0.0254 volts |
| t = 20.0 hours | ec = 0.75 |
| u = 0.05 | ed = 15.4 volts* °F. |
| v = 70.0 amp-hours | ee = 80.0° F. |
| w = 4.0 hours | fa = 0.1554 |
| y = 10.0 amps | fb = 2.5 |
| z = 66.0 amp-hours | ga = 0.8065 |
| xa = 1.0e-4 | gb = 1.0 |
| xb = 1.0e-3 hours-2 | ha = 16.16 volts |
| aa = 62.5 amp-hours | hb = 90.0 volts* °F. |
| ab = 11050.0° F.*amp-hours | hc = 100° F. |
| ac = 96.8° F. | hd = 0.201 |
| ad = 1.0 | he = 6.0 |
| ae = 0.451 | hf = 1.0 volts |
| af = 23.3 amps | ja = −200.0° F. |
| ba = 4.92e-10 amps | jb = 80.0° F. |
| bb = 11.687 volts | jc = 0.5 |
| bc = 46.46° F. | jd = 80.0° F. |
| bd = 3.5 | je = −0.05 |
| ca = 0.5 | jf = 0.5 |

Figure 2:
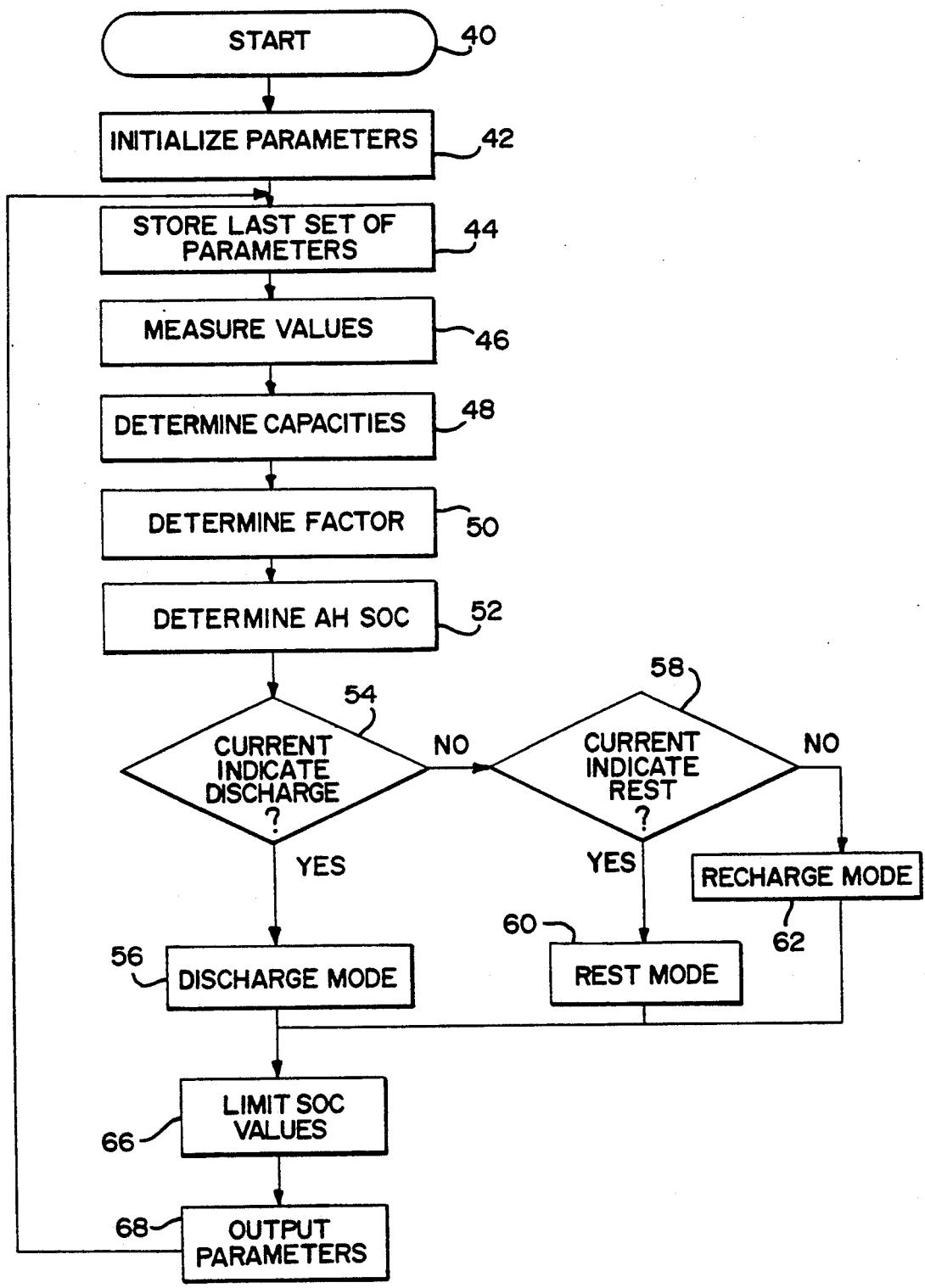
FIG. 2 is a flow diagram illustrating the manner in which the battery monitor of FIG. 1 may be implemented for monitoring a battery in accordance with the present invention.

Referring now to FIG. 2, it is an overall flow diagram illustrating the manner in which the battery monitor 10 illustrated in FIG. 1 may be implemented for monitoring operating parameters of a battery, such as battery 12. The battery monitor 10 begins in step 40 at start. As previously mentioned, the battery monitor 10 is implemented in accordance with an iterative process which utilizes previously determined battery parameters for determining, at spaced apart time intervals, new battery operating parameters. As a result, when the battery monitor 10 is initialized, it first must initialize the various operating parameters in step 42 for use in the first determination of the operating parameters of the battery. The parameters of the batter to be initialized are the capacity of the battery (capacity), the integrated amp-hour state of charge of the battery (socahint), the absolute state of charge of the battery (abssoc), the estimated state of charge of the battery (soc), the time period at which the battery has been at rest (etime), the factor which is the difference between the absolute state of charge of the battery and the relative state of charge of the battery (factor), and the current of the battery (current). These parameters are initialized with the capacity being equal to constant a, the integrated amp-hour state of charge of the battery equal to constant b, the absolute state of charge of the battery equal to constant b, and the estimated state of charge of the battery equal to constant b. The other initialized parameters are set equal to zero.

Next, in step 44, the battery monitor 10 stores, in the random access memory 30, selected ones of the last measured and determined parameters. The battery monitor 10 stores in the second memory 30 the last battery current (Lcurrent), the last determined integrated amp-hour state of charge of the battery (Lsocahint), the last determined absolute state of charge of the battery (Labssoc), the last determined factor (Lfactor), and the last determined capacity of the battery (Lcapacity). When this is the first iteration following initialization of the battery monitor 10, the battery monitor 10 stores the initialized parameters in the second memory 30. Otherwise, the battery monitor 10 stores the above-noted parameters in the second memory 30 which were determined during the last iteration.

After storing the selected ones of the last measured and determined parameters in step 44, the battery monitor then in step 46 measures the present values of the battery current (current), the battery voltage (volt), the battery temperature in degrees fahrenheit (tempf), and the time since the last iteration (deltime). The processor in step 46 reads the voltage sensor signal from the voltage sensor 20 to determine the present battery voltage, the current sensor signal from the current sensor 18 to determine the present battery current, and the temperature sensor signal from the temperature sensor 22 to determine the battery temperature. The processor 26 further computes the time period since the last iteration responsive to the timing signals provided by the timer 24.

As previously mentioned, if the battery monitor 10 is implemented for determining the operating parameters of the battery at periodic intervals, the time since the last iteration may be treated as a constant, and therefore need not be determined by the processor 26. In addition, if the battery to be monitored is operated under known and constant temperature conditions, the temperature of the battery may also be treated as a constant and, in such a case, the processor 26 need not read a temperature sensor signal from the temperature sensor 22.

After determining the aforementioned values in step 46, the battery monitor 10 proceeds to step 48 to determine the rated capacity (ratedcap) of the battery, and the current capacity (crntcap) of the battery. Before determining the rated capacity and current capacity of the battery, the processor 26 first determines a temperature compensating factor (tempcomp) which provides temperature compensation for the rated capacity and the current capacity. The processor 26 computes the temperature compensating factor in accordance with the relationship given below.

$$tempcomp = aa - \frac{ab}{temf - ac}$$

After determining the temperature compensating factor, the processor 26 then determines the rated capacity of the battery in accordance with the relationship immediately below.

ratedcap = Lcapacity + tempcomp

Lastly, in performing step 48, the processor 26 determines the current capacity of the battery by utilizing the relationship immediately below wherein $|I|$ represents the absolute value of the current of the battery.

$$crntcap = Lcapacity \times \left(ad - \frac{ae \times |I|}{|I| + af}\right) + tempcomp$$

After determining the capacities in step 48, the processor 26 then, in step 50, determines the factor which, as previously mentioned, represents the difference between the absolute state of charge of the battery and the relative state of charge of the battery. The processor 26 determines the factor in step 50 in accordance with the following relationship wherein $\Delta t$ is the time since the last iteration (deltime).

$$factor = Lfactor +$$

$$\frac{|m + Lcurrent| \times (ratedcap - crntcap) \times (\Delta t)}{(ratedcap \times crntcap)}$$

After determining the factor in step 50, the processor then in step 52 uses amp-hour integration to determine initial values of the integrated amp-hour state of charge, the absolute state of charge, and the relative state of charge (relsoc) of the battery. In performing step 50, the processor first determines the state of charge used by the battery (socused) since the last iteration. The state of charge used by the battery is determined by the relationship immediately below.

$$socused = \frac{-Lcurrent \times \Delta t}{ratedcap}$$

After determining the state of charge used by the battery since the last iteration, the processor 26 then determines the integrated amp-hour state of charge of the battery in accordance with the relationship immediately below.

socahint = Lsocahint − socused

After determining the integrated amp-hour state of charge of the battery, the processor 26 then determines the absolute state of charge of the battery by utilizing the following relationship.

abssoc = Labssoc − socused

Lastly, in completing step 52, the processor 26 determines the relative state of charge of the battery. The processor 26 determines the relative state of charge of the battery by utilizing the relationship immediately below.

relsoc = abssoc − facto

Following step 52, the battery monitor 10 determines whether the battery is in discharge, is at rest, or is in recharge. The battery monitor 10 accomplishes this by the processor 26 first determining in step 54 if the battery is in discharge. The processor 26 performs step 54 by determining if the current determined in step 46 is less than a negative current (−c) which is the maximum current magnitude which would indicate that the battery is at rest. If the battery current is less than this current, the battery is considered to be in discharge and the battery monitor 10 enters the discharge mode as indicated at reference character 56 which will be described in detail hereinafter with respect to FIG. 3.

If the battery is not in discharge, the microprocessor then in step 58 determines if the battery is at rest. In performing step 58, the microprocessor determines if the battery current is equal to or less than zero but greater or equal to than −c. If the battery is at rest, the processor 26 enters the rest mode as indicated at reference character 60 which will be described in detail hereinafter with respect to FIG. 4. If the battery is not in discharge and not at rest, it will therefore be considered to be in recharge and the battery monitor will then enter a recharge mode as indicated at reference character 62. The recharge mode will be described hereinafter in detail with respect to FIG. 5.

After the discharge mode 56, the rest mode 60, or the recharge mode 62 is completed, the battery monitor then proceeds to step 66 to limit the state of charge values determined in the discharge mode 56, the rest mode 60, or the recharge mode 62 in a manner to be described in greater detail hereinafter. After performing step 66, the battery monitor 10 proceeds to step 68 to provide the output parameter signals indicative of the operating parameters of the battery by the output means 32 at output 16 and awaits to begin the next iteration. Thereafter, the battery monitor 10 returns to step 44 to store the last measured and determined selected operating parameters of the battery to be used during the next iteration.

Figure 3:
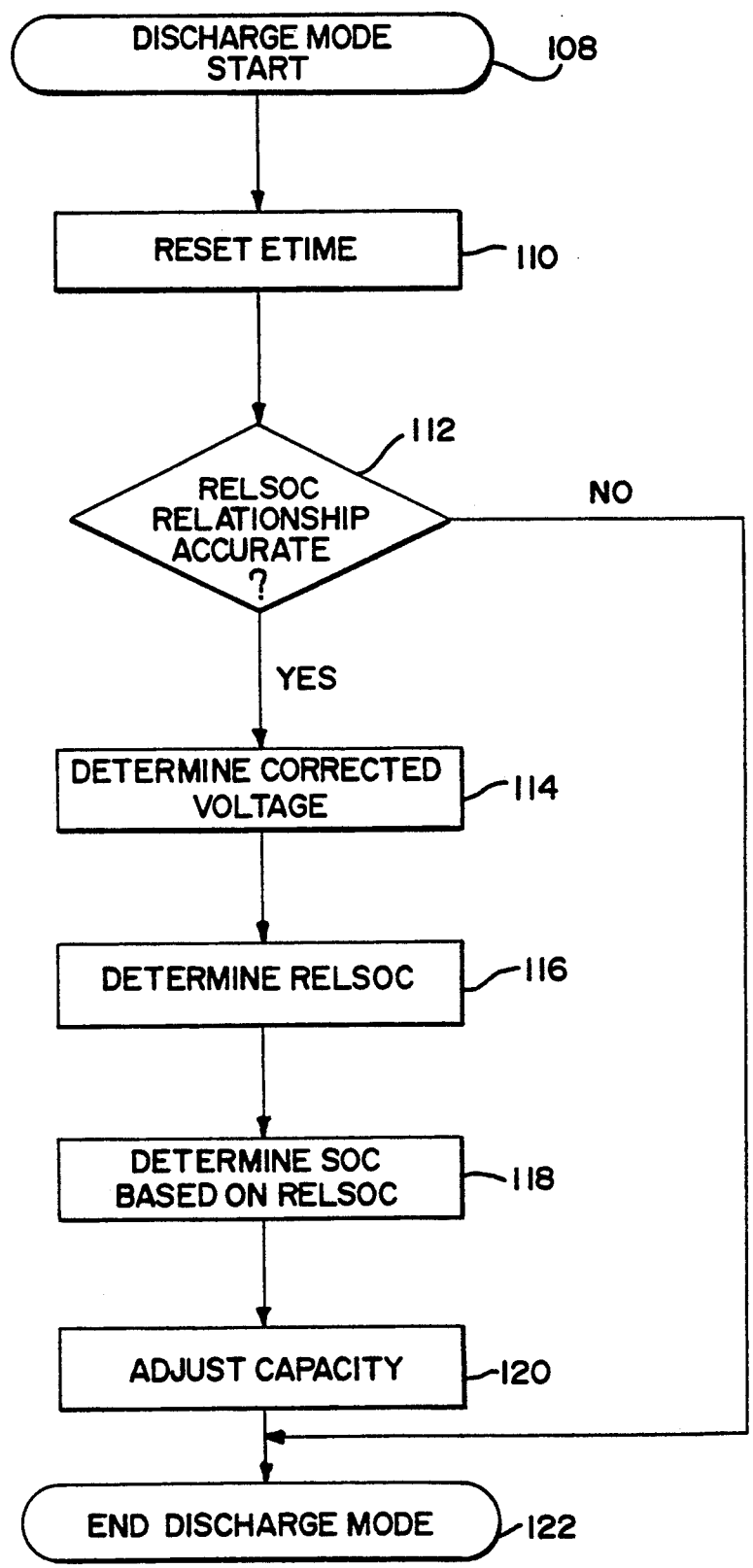
FIG. 3 is a flow diagram illustrating the manner in which the battery monitor of FIG. 1 may be implemented for monitoring a battery under discharge in accordance with the present invention.

Referring now to FIG. 3, it illustrates the manner in which the battery monitor 10 may be implemented for performing the discharge mode 56 illustrated in FIG. 2. The discharge mode starts at the start step 108. First, in step 110, the processor 26 resets timer 38 to reset the etime to zero since the battery is not at rest. Next, the processor 26 in step 112 determines if the relative state of charge relationship to be described hereinafter will be accurate. In performing step 112, the microprocessor determines if the current is less than a negative current (−e) which is the minimum current magnitude for which the discharge mode relative state of charge relationship is accurate. If the current is not less than −e, the microprocessor does not perform the discharge mode and returns at end step 122. However, if the current is less than −e, the processor then continues to step 114 to determine a corrected voltage ($V_{pp}$). In performing step 114, the processor 26 utilizes the relationship immediately below.

$$V_{pp} = \text{volt} - ea + ebx(|I|)^{ec} + \frac{ed}{tempf + ee}$$

After determining the corrected voltage in step 114, the processor then proceeds to step 116 to determine the relative state of charge of the battery. In determining the relative state of charge of the battery in step 116, the microprocessor utilizes the relationship immediately below.

$$relsoc = fa \times \left(\frac{|V_{pp}|}{j}\right)^{fb}, \text{ if } V_{pp} < 0, relsoc = -relsoc$$

It will be seen from above that if the corrected voltage ($V_{pp}$) is less than zero, the processor 26 sets the relative state of charge value as the negative of the relative state of charge value determined by the relationship immediately above.

After determining the relative state of charge in step 116, the processor then proceeds to step 118 to determine the state of charge of the battery based upon the relative state of charge determined in step 116. In performing step 118, the microprocessor utilizes the relationship immediately below.

abssoc = relsoc + facto

Before moving on to the next step, the processor places limits upon change in the absolute state of charge as determined by the relationship immediately above. In placing limits upon the change in absolute state of charge value from the last iteration, the microprocessor utilizes the following relationships.

if Labssoc − abssoc < ca × socused, then
abssoc = Labssoc − ca × socused if Labssoc − abssoc > cb × socused, then
abssoc = Labssoc − cb × socused After placing limits upon the change in absolute state of charge determined in step 118, the processor then in step 120 adjusts the capacity of the battery based upon the absolute state of charge determined in step 118 and the integrated amp-hour state of charge as defined in step 52. In performing step 120, the processor utilizes the following relationship.

capacity = Lcapacity − y × (1 − abssoc) × (socahint − abssoc) × Δt

Once the Capacity of the battery has been adjusted in step 120, the processor completes the discharge mode at step 122 and proceeds to step 66 as described earlier. As can be seen from the foregoing, the relative state of charge of the battery is determined with a high degree of accuracy without the need of determining the internal resistance of the battery which, in the prior art, has been error prone and required a fluctuating current. Furthermore, by virtue of the present invention, the battery monitor 10 also determines the absolute state of charge of the battery based upon the relative state of charge of the battery within reasonable limits and makes an adjustment to the capacity of the battery based upon the determined absolute state of charge of the battery.

Figure 4:
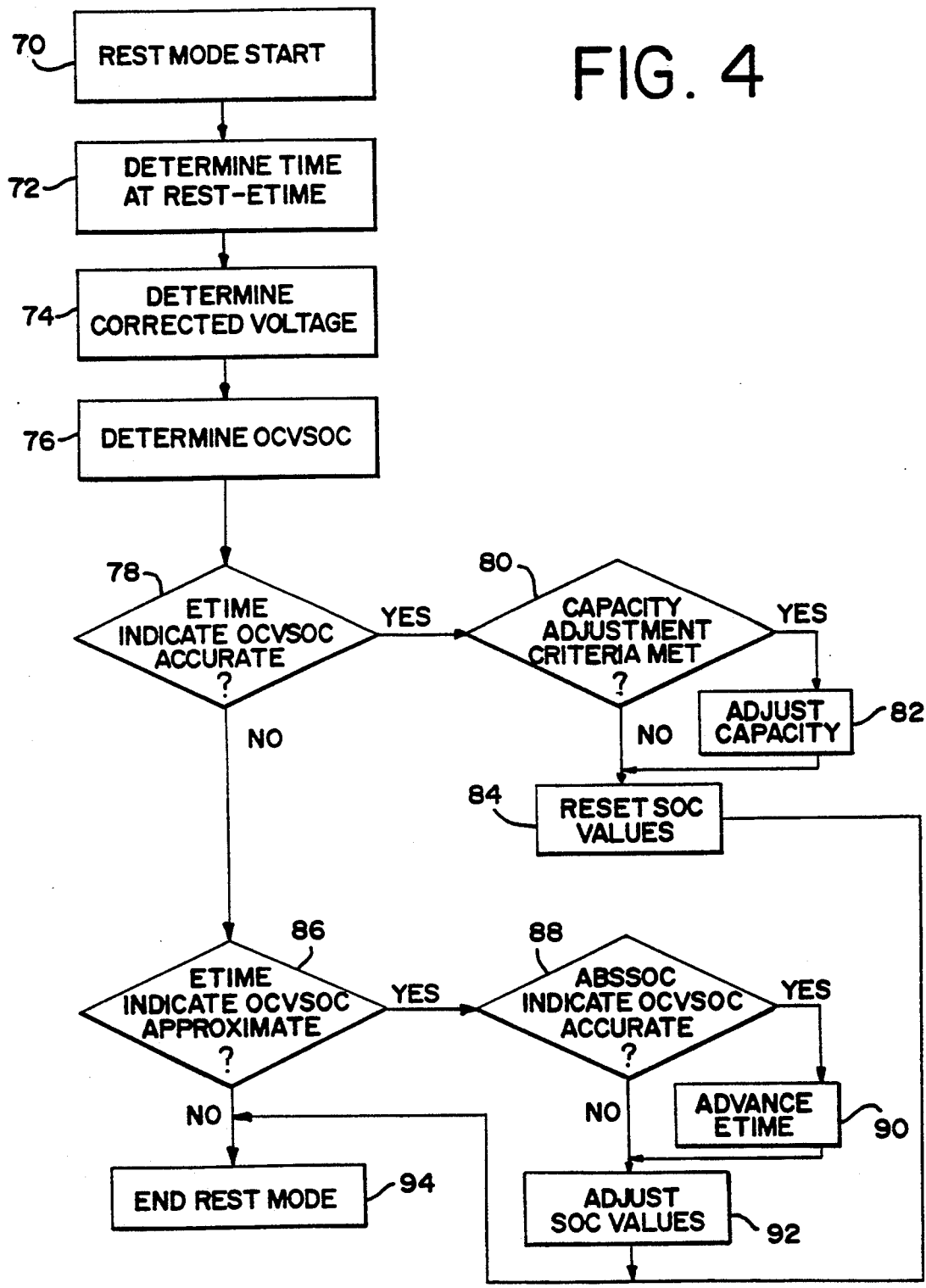
FIG. 4 is a flow diagram illustrating the manner in which the battery monitor of FIG. 1 may be implemented for monitoring a battery at rest in accordance with the present invention.

Referring now to FIG. 4, it illustrates the manner in which the battery monitor 10 may be implemented for performing the rest mode 60 as illustrated in FIG. 2 in accordance with the present invention. The rest mode begins at start step 70. The processor 26 first, in step 72, determines from timer 38 the time at which the battery has been at rest (etime). In performing step 72, the processor adds the time since the last iteration (deltime) to the rest time (etime) stored in the second memory 30.

Next, in step 74, the battery monitor 10 determines a corrected voltage for the battery while at rest. In determining the corrected voltage (the open circuit voltage) of the battery while at rest, the processor 26 utilizes the expression immediately below for adjusting the presently measured battery voltage for current and temperature conditions.

$$ocv = \frac{\left(db \times \left(\frac{|I|}{d}\right)^{dd}\right)}{\left(\frac{tempf + dc}{k}\right)^{de}} + df(tempf + dg) + \text{volt} - da$$

After determining the corrected voltage of the battery, the processor 26 then proceeds to step 76 to determine the open circuit voltage state of charge of the battery. In performing step 76 the processor 26 uses the relationship below.

$$ocvsoc = ga \times \left(\frac{|ocv|}{j}\right)^{gb}, \text{ if } ocv < 0, ocvsoc = -ocvsoc$$

As can be seen from the above, if the corrected voltage is less than zero, then the open circuit voltage state of charge of the battery when at rest is considered to be the negative of the determined open circuit voltage state of charge value. This final value of the open circuit voltage state of charge of the battery is utilized to determine the absolute state of charge of the battery when at rest.

Before determining the absolute state of charge of the battery when at rest, the processor first determines in step 78 if the open circuit voltage state of charge value determined in step 76 is accurate. The open circuit voltage state of charge value is determined to be accurate if the battery has remained at rest for a sufficient period of time to allow the battery voltage to settle out from its last usage or by other means which will be described hereinafter, wherein these other means will advance the timer 38 (etime). In performing step 78, the microprocessor determines if the time at which the battery has been at rest is greater than a first time period t, which has been previously described. If the battery has been at rest for a time greater than t, then the processor proceeds to step 80 to determine if a capacity adjustment criteria has been met. In performing step 80, the processor determines if the difference between the absolute state of charge of the battery and the last state of charge of the battery stored in the second memory 30 is greater than a constant u which is the change in the state of charge required to safely adjust the capacity value. If the criteria has been met, the processor then proceeds to step 82 to adjust the capacity of the battery in accordance with the relationship immediately below.

capacity = Lcapacity − v × (abssoc − Lsoc) × (abssoc − socahint)

After adjusting the capacity of the battery in accordance with step 82, or after determining that the capacity adjustment criteria has not been met in step 80, the processor 26 then proceeds to step 84 to reset the state of charge values. In performing step 84, the processor sets the absolute state of charge equal to the open circuit voltage state of charge as determined in step 76 by overwriting the absolute state of charge value previously determined in step 52 with the open circuit voltage state of charge value determined in step 76. Also, the processor overwrites the integrated amp-hour state of charge value previously determined in step 52 with the open circuit voltage state of charge value determined in step 76 and sets the last state of charge value stored in the second memory 30 equal to the open circuit voltage state of charge value. Thereafter, the processor completes the rest mode at step 94 and proceeds to step 66 as described earlier.

If in step 78 the processor 26 determined that the rest time of the battery was insufficient to indicate that the open circuit voltage state of charge relationship was accurate, the microprocessor then proceeds to step 86 to determine if the rest time of the battery indicates that the open circuit state of charge value determined in step 76 is approximate. In performing step 86, the processor determines if the rest time of the battery is greater than an intermediate time period w which is the time required to partially allow the battery voltage to settle from its last usage and hence, is less than the time t. If the battery rest time indicates that the open circuit voltage state of charge value determined in step 76 is not approximate, the processor completes the rest mode at step 94 and proceeds to step 66 as described earlier. However, if in step 86, it determines that the open circuit voltage state of charge value determined in step 76 is approximate, the processor then proceeds to step 88 to determine if the absolute state of charge previously determined in step 52 would indicate that the open circuit voltage state of charge value determined in step 76 is accurate.

In performing step 88, the processor 26 determines if the absolute value of the difference between the open circuit voltage state of charge determined in step 76 and the absolute state of charge determined in step 52 is less than a constant h which is the value used to determine if the open circuit voltage state of charge is close enough to the actual state of charge to be used. If it is, the processor then advances the rest time of the battery to equal time t in step 90 so that upon the next iteration during rest, the processor, when performing step 78, will proceed to step 80 in finding the open circuit voltage state of charge value determined in step 76 to be accurate. If however the absolute state of charge determined in step 52 indicates that the open circuit voltage state of charge value determined in step 76 is not close enough, the battery monitor 10 then proceeds to step 92 to adjust the state of charge values. In performing step 92, the processor sets the absolute state of charge equal to the open circuit voltage state of charge determined in step 76 and places band limits on the absolute state of charge by utilizing the band relationship indicated below.

$$band = xa + xb \times (etime) \times (\Delta t)$$

if abssoc > labssoc + band, then
abssoc = labssoc + band if abssoc < labssoc − band, abssoc = labssoc − band In completing step 92, the processor then determines if the absolute state of charge determined in step 52 is within the band limits as shown above. These band limits define a given range such that the magnitude of the difference between the last absolute state of charge value and the band limits is less then the band. If the absolute state of charge value is within the band limits, no adjustment is made and the processor completes the rest mode at step 94 and proceeds to step 66 as described earlier. If the absolute state of charge value is outside the band limits, the absolute state of charge is set equal to the appropriate band limit, and then the processor completes the rest mode at step 94 and proceeds to step 66 as described earlier.

Referring now to FIG. 5, it illustrates the manner in which the battery monitor 10 may be implemented for performing the recharge mode 62 illustrated in FIG. 2 in accordance with the present invention. In implementing the recharge mode, the battery monitor 10 begins at start step 96. In step 98, the battery monitor 10 first causes the processor 26 to reset the rest time of the battery (etime) to zero because the battery is not at rest. Next, in step 100, the processor 26 determines the amount of recharge current which is not being utilized for recharging the battery. This current is commonly referred to in the art as the gassing current (igas). In performing step 100, the processor utilizes the relationship immediately below.

$$igas = ba \times \left| \left( \frac{volt - bb}{j} \right) \times \left( \frac{tempf + bc}{k} \right) \right|^{bd}$$

After determining the gassing current in step 100, the processor then proceeds to step 102 to adjust the state of charge used by the battery to account for the inefficiency determined in step 100. In performing step 102, the processor determines if the last current stored in the second memory 30 is greater than the gassing current. If it is, the processor then determines a recalculated state of charge used by using the relationship immediately below.

$$\text{if } Lcurrent > igas \text{ then, } socused = \frac{-(Lcurrent - igas) \times (\Delta t)}{ratedcap}$$

Since the battery is in recharge, the state of charge used by the battery since the last iteration will be a negative number and hence is really the state of charge added to the battery since the last iteration. Following step 102, the processor then proceeds to step 104 to adjust the state of charge values determined in step 52 based upon the negative state of charge used by the battery during recharge as determined in either step 102 or step 52 depending upon the value of the gassing current and since the last iteration. In performing step 104, the processor first determines the integrated amp-hour state of charge of the battery by utilizing the immediately following relationship.

$$socahint = Lsocahint - socused$$

The integrated amp-hour state of charge of the battery as determined by the relationship immediately above is utilized to track the integrated amp-hour state of charge of the battery for determining battery capacity when the battery returns to a rest condition or a discharge condition. In completing step 104, the battery monitor 10 also determines the absolute state of charge of the battery by the processor 26 utilizing the relationship immediately below.

$$abssoc = Labssoc - socused$$

As can be seen, the new absolute state of charge of the battery is equal to the last absolute state of charge of the battery stored in the random access memory 30 minus the state of charge used by the battery since the last iteration. Since the batter is in recharge, the state of charge used by the battery since the last iteration will be a negative value and thus, the absolute state of charge of the battery will be equal to the last absolute state of charge of the battery plus the state of charge added to the battery by the recharging thereof since the last iteration.

Also in performing step 104, the battery monitor determines a new factor in accordance with the expression immediately below.

$$factor = Lfactor + socused$$

After the new factor is determined by the expression immediately above, the microprocessor overwrites the previously determined factor which was determined in step 50. The processor then may also proceed to determine a new relative state of charge of the battery by determining the difference between the new absolute state of charge of the battery and the newly determined factor. Upon completing step 104, the processor completes the recharge mode at step 106 and proceeds to step 66 of FIG. 2 as described earlier.

Referring again to FIG. 2, and more particularly to step 66, the processor 26 performs step 66 to limit the state of charge values determined during this iteration. In limiting the state of charge values, the processor first determines if the capacity is greater than z which represents the maximum expected battery capacity for the type being monitored. If the capacity is greater than z, then the processor sets the capacity equal to z.

If the factor is less than zero, then the processor sets the factor equal to zero. If the absolute state of charge is greater than one, then the processor sets the absolute state of charge equal to one. If the absolute state of charge is less than zero, then the processor sets the absolute state of charge to zero. If the integrated amp-hour state of charge is greater than one, then the processor sets the integrated amp-hour state of charge equal to one. If the integrated amp-hour state of charge is less than zero, then the processor sets the integrated amp-hour state of charge equal to zero. If the relative state of charge is greater than the absolute state of charge minus the factor, then the processor sets the relative state of charge equal to the absolute state of charge minus the factor. Lastly, in step 66, if the relative state of charge is less than zero, the processor sets the relative state of charge equal to zero.

Following step 66 wherein the processor limits the state of charge values, it then proceeds to step 68 to cause the output means 32 to output signals indicative of the operating parameters of the battery. One output signal may be indicative of the relative state of charge of the battery. Another output signal ma be indicative of the absolute state of charge of the battery. Another output signal may be indicative of the battery capacity which is the battery capacity, if fully charged, at a current level (curr). To cause the output means to provide this signal, the processor first determines the output battery capacity (cap) according to the following relationship.

$$cap = capacity \times \left( ad - \frac{ae \times |curr|}{|curr| + af} \right) + tempcomp$$

Another output signal provided by the output means 32 may be indicative of the output battery capacity (dcap) remaining at the current level (curr). In causing the output means to output this signal (dcap), the processor utilizes the following relationship.

$$dcap = relsoc \times cap$$

Another output signal provided by output means 32 may be indicative of the time to empty of the battery at the current level (curr). This is the time in which a 12 volt battery will be discharged to 10.5 volts if it is continued to be discharged at the current level (curr). To cause the output means to output this signal, the microprocessor utilizes the relationship immediately below.

$$TTE = \frac{dcap}{|cuur|}$$

A still further output signal may be an output signal indicative of the amp-hours required to fully recharge the battery. In causing the output means to output this signal, the microprocessor utilizes the following relationship.

$$ccap = (1 - abssoc) \times ratedcap$$

Another output signal which may be provided by the output means 32 is a signal which indicates the time to fully recharge the battery if the battery is recharged at a current level (curr). This signal may be referred to as the time to full (ttf) and in causing the output means 32 to provide this signal, the processor 26 utilizes the expression immediately below.

$$TTF = \frac{ccap}{curr}$$

A still further output signal provided by the output means 32 indicative of the operating parameters of the battery being monitored is a recommended recharge voltage (rvolt). This signal indicates a recommended recharge voltage which maximizes recharge time while minimizing damage to the battery during recharge. In causing the output means 32 to provide this signal, the processor 26 utilizes the following relationship.

$$rvolt = ha + \frac{hb}{tempf + hc} - hf \times (relsoc + hd)^{he}$$

Further, the output means 32 may provide an output signal indicative of the critical restart temperature for the battery. This temperature is the temperature below which the battery will be incapable of starting an engine, for example. In causing the output means 32 to provide this output signal, the processor 26 utilizes the following relationship.

$$stemp = ja + \frac{jb}{(abssoc)^{jc}} + \frac{jd}{\left(\frac{capacity}{z} - je\right)^{jf}}$$

As can be seen from the foregoing, the present invention provides a new and improved battery monitor and method for monitoring the operating parameters of a battery. The battery monitor of the present invention is capable of monitoring and providing output signals indicative of the operating parameters of the battery whether the battery is in discharge, rest, or is in recharge. The operating parameters provided by the battery monitor of the present invention not only includes the capacity of the battery when the battery is in discharge or recharge, but in addition, the absolute state of charge of the battery and the relative state of charge of the battery whether the battery is in discharge, recharge, or at rest. In addition, the battery monitor of the present invention provides other useful information and indications to a user including the time in which the battery will be discharged, the time in which the battery will be fully charged when being recharged, and an indication when the temperature is below a critical restart temperature.

By virtue of the present invention, such indications are made possible without the previously required determinations of internal resistance of the battery. Furthermore, such indications can be made on the fly without the battery having to be removed from its application to determine its current state of charge or capacity independent of the operating mode.

While a particular embodiment of the present invention has been shown and described, modifications may be made, and is therefore intended in the appended claims to cover all such changes and modifications which fall within the true spirit and scope of the invention.

What is claimed is:

1. A battery monitor for monitoring operating parameters of a battery, said battery monitor comprising:
   voltage sensor means for sensing batter voltage and providing a voltage sensor signal indicative of said battery voltage;
   current sensor means for sensing battery current and providing a current sensor signal indicative of said battery current;
   processing means coupled to said voltage sensor means and said current sensor means for reading said voltage sensor signal, for reading said current sensor signal, and for computing said operating parameters at spaced apart computing times;
   memory means coupled to said processing means for storing selected ones of the last computed said operating parameters;
   said processing means determining when said battery is in discharge and computing, responsive to said voltage sensor signal and said current sensor signal, a corrected battery voltage and, from said corrected battery voltage, computing relative state of charge of said battery, said processing means computing a factor representing the difference between absolute state of charge of said battery and sad relative state of charge of said battery, said processing means computing said absolute state of charge of said battery from a sum of said relative state of charge of said battery and said factor; and
   output means coupled to said processing means for providing output signals indicative of predetermined ones of said operating parameters.

2. A battery monitor as defined in claim 1 further including temperature sensing means for sensing the battery temperature and providing said processing means with a temperature sensor signal indicative of said battery temperature and wherein said processing means computes said corrected battery voltage responsive to said temperature sensor signal.

3. A battery monitor as defined in claim 1 wherein said processing means computes the rated capacity of said battery and the current capacity of said battery.

4. A battery monitor as defined in claim 3 wherein said processing means further stores the last read said current sensor signal and the last computed said factor of said battery in said memory means.

5. A battery monitor as defined in claim 4 wherein said processing means computes said factor based upon said rated capacity of said battery, said current capacity of said battery, said stored last computed factor of said battery, the time since the last said computing time, and said stored last read current sensor signal.

6. A battery monitor as defined in claim 3 wherein said processing means further computes the capacity of said battery and stores said capacity of said battery in said memory means.

7. A battery monitor as defined in claim 6 wherein said processing means computes said rated capacity of said battery based upon said stored capacity and computes said current capacity of said battery based upon said stored capacity and said current sensor signal.

8. A battery monitor as defined in claim 6 wherein said processing means computes the integrated amp hour state of charge of said battery and computes said capacity of said battery based upon said stored capacity, said absolute state of charge of said battery, said integrated amp-hour state of charge of said battery and the time since the last said computing time.

9. A battery monitor as defined in claim 3 further including temperature sensing means for sensing the battery temperature and providing said processing means with a temperature sensor signal indicative of said battery temperature and wherein said processing means is further responsive to said temperature sensor signal for computing a temperature compensation value for computing said rated capacity of said battery and said current capacity of said battery.

10. A battery monitor as defined in claim 1 wherein said processing means stores said absolute state of charge of said battery and said factor in said memory means.

11. A battery monitor as defined in claim 10 wherein said processing means limits the value of said computed absolute state of charge of said battery and stores said limited absolute state of charge value of said battery in said memory means.

12. A battery monitor as defined in claim 11 wherein said processing means further computes the state of charge used by said battery since the last s id computing time.

13. A battery monitor as defined in claim 12 wherein said processing means limits the value of said computed absolute state of charge of said battery between the difference between the last stored said limited absolute state of charge value and the quantity of a first constant times said state of charge used by said battery and the difference between the last stored said limited absolute state of charge value and the quantity of a second constant times the said state of charge used by said battery.

14. A battery monitor as defined i claim 1 wherein said processing means limits the value of said computed relative state of charge of said battery and stores said limited relative state of charge value of said battery in said memory means.

15. A battery monitor as defined in claim 14 wherein said processing means further computes the state of charge used by said battery since the last said computing time.

16. A battery monitor as defined in claim 15 wherein said processing means limits the value of said computed relative state of charge of said battery between the difference between the last stored said limited relative state of charge value and the quantity of a first constant times the said state of charge used by said battery and the difference between the last stored said limited relative state of charge value and the quantity of a second constant times the said state of charge used by said battery.

17. A battery monitor as defined in claim 1 wherein said processing means computes at each of said computing times the relative state of charge of said battery and wherein said output signals include an output signal indicative of said relative state of charge of said battery.

18. A battery monitor as defined in claim 1 wherein said processing means computes at each of said computing times the absolute state of charge of said battery and wherein said output signals include an output signal indicative of said absolute state of charge of said battery.

19. A battery monitor as defined in claim 1 wherein said processing means computes at each of said computing times the fully charged output capacity of said battery at a given discharge current and wherein said output signals include an output signal indicative of said fully charged output capacity of said battery at said given discharge current.

20. A battery monitor as defined in claim 1 wherein said processing means computes at each of said computing times the remaining output capacity of said battery at a given discharge current and wherein said output signals include an output signal indicative of said remaining output capacity.

21. A battery monitor as defined in claim 1 wherein said processing means computes at each of said computing times the time to empty of said battery representing the time in which said battery will be fully discharged at a given discharge current and wherein said output signals include an output signal indicative of said time to empty.

22. A battery monitor as defined in claim 1 wherein said processing means computes at each of said computing times the required amp-hours to fully recharge said battery and wherein said output signals include an output signal indicative of said amp-hours to fully recharge said battery.

23. A battery monitor as defined in claim 1 wherein said processing means computes at each of said computing times the time to fully recharge said battery at a given recharge current and wherein said output signals include an output signal indicative of said time to fully recharge said battery.

24. A battery monitor as defined in claim 1 wherein said processing means computes at each of said computing times a recommended recharge voltage for recharging said battery and wherein said output signals include an output signal indicative of said recommended recharge voltage.

25. A battery monitor as defined in claim 1 wherein said processing means at each of said computing times computes a critical restart temperature of said battery and wherein said output signals include an output signal indicative of said critical restart temperature of said battery.

26. A battery monitor for monitoring operating parameters of a battery, said battery monitor comprising:
   voltage sensor means for sensing battery voltage and providing a voltage sensor signal indicative of said battery voltage;
   current sensor means for sensing battery current and providing a current sensor signal indicative of said battery current;
   processing means coupled to said voltage sensor means and said current sensor means for reading said voltage sensor signal, for reading said current sensor signal, and for computing said operating parameters at spaced apart computing times;
   memory means coupled to said processing means for storing selected one of the last computed said operating parameters;
   said processing means determining when said battery is at rest and computing, responsive to said voltage sensor signal and said current sensor signal, an open circuit voltage of said battery and from said open circuit voltage, computing an open circuit voltage state of charge of said battery, said processing means determining if said open circuit voltage is accurate and setting absolute state of charge of said battery equal to said open circuit state of charge of said battery when said processing means determines that said open circuit voltage state of charge is accurate; and
   output means coupled to said processing means for providing output signals indicative of predetermined ones of said operating parameters.

27. A battery monitor as defined in claim 26 further including timing means for determining the time in which said battery is at rest.

28. A battery monitor as defined in claim 27 wherein said processing means resets said timing means when said battery is not at rest.

29. A battery monitor as defined in claim 27 wherein said processing means is further responsive to said current sensor signal for determining if said battery is at rest or not at rest.

30. A batter monitor as defined in claim 29 wherein, when said battery is not at rest, said processing means resets the said time in which said battery is at rest.

31. A battery monitor as defined in claim 29 wherein said processing means increments said timing means with the time since the last said computing time when said battery is at rest.

32. A battery monitor as defined in claim 27 wherein said processing means determines if said battery has been at rest for a period of time greater than a first time period and determines that said open circuit voltage state of charge is accurate when said battery has been at rest for a period of time greater than said first time period.

33. A battery monitor as defined in claim 27 wherein said processing means determines if said battery has been at rest for an intermediate time period greater than a second time period but less than a first time period.

34. A battery monitor as defined in claim 33 wherein said processing means computes the absolute state of charge of said battery prior to determining if said battery has been at rest for said intermediate time period.

35. A battery monitor as defined in claim 34 wherein said processing means also computes the relative state of charge of said battery responsive to said absolute state of charge of said battery and a last computed factor stored in said memory means, wherein said factor represents the difference between said absolute state of charge of said battery and said relative state of charge of said battery.

36. A battery monitor as defined in claim 34 wherein said processing means determines, when said battery has been at rest for said intermediate time period, if the difference between said open circuit voltage state of charge and the absolute state of charge of said battery is less than a given magnitude and determines that said open circuit voltage state of charge is accurate when said difference is less than said given magnitude.

37. A battery monitor as defined in claim 36 wherein said processing means advances said timing means to said first time period upon determining that said open circuit voltage state of charge is accurate.

38. A battery monitor as defined in claim 34 wherein said processing means determines a given range of values such that the magnitude of the difference between said given range of values and said absolute state of charge of said battery is less than a constant.

39. A battery monitor as defined in claim 38 wherein said processing means computes said given range of values responsive to the time since the last computing time and the time since said battery was last not at rest.

40. A battery monitor as defined in claim 38 wherein, when said battery has been at rest for said intermediate time period, said processing means sets said absolute state of charge of said battery equal to said open circuit voltage state of charge of said battery and adjusts said absolute state of charge of sid battery to within said given range of values if sid open circuit voltage state of charge of said battery is outside of said given range of values.

41. A battery monitor as defined in claim 26 further including temperature sensing means for sensing the battery temperature and providing said processing means with a temperature sensing signal indicative of said battery temperature, and wherein said processing means is further responsive to said temperature sensor signal for computing said open circuit voltage of said battery.

42. A battery monitor as defined in claim 26 wherein said processing means further computes the integrated amp-hour state of charge of said battery, the capacity of said battery and stores the last computed said capacity of said battery and the last state of charge value.

43. A battery monitor as defined in claim 42 wherein said processing means determines if the difference between said last state of charge value and said absolute state of charge is greater than a given amount and computes said capacity responsive to the last computed capacity, said absolute state of charge, said last state of charge value, and said integrated amp-hour state of charge of said battery when said difference between said last state of charge value and said absolute state of charge is greater than said given amount.

44. A battery monitor for monitoring operating parameters of a battery, said battery monitor comprising:

voltage sensor means for sensing batter voltage and providing a voltage sensor signal indicative of said battery voltage;

current sensor means for sensing battery current and providing a current sensor signal indicative of said battery current;

processing means coupled to said voltage sensor means and said current sensor means for reading said voltage sensor signal, for reading said current sensor signal, and for computing said operating parameters at spaced apart computing times;

memory means coupled to said processing means for storing selected ones of the last computed said operating parameters;

said processing means determining in response to said current sensor signal if said battery is in recharge, said processing means determining state of charge added to said battery since the last said computing time, said processing means computing at each of said computing times and storing in said memory means absolute state of charge of said batter, said processing means computing at each of said computing times and storing in said memory means a factor representing the difference between said absolute state of charge of said battery and relative state of charge of said battery; and output means coupled to said processing means for providing output signals indicative of predetermined ones of said operating parameters.

45. A battery monitor as defined in claim 44 wherein said processing means computes said factor by determining, when said battery is in recharge, the difference between the last said factor stored in said memory means and the state of charge added to said battery.

46. A battery monitor as defined in claim 44 wherein said processing means further computes the relative state of charge of said battery responsive to said absolute state of charge of said battery and the last computed factor stored in said memory means.

47. A battery monitor as defined in claim 44 wherein, when said battery is in recharge, said processing means computes the gassing current of said battery representing the amount of recharge current which is not being used to recharge said battery.

48. A battery monitor as defined in claim 47 wherein said processing means computes said gassing current responsive to said voltage sensor signal.

49. A battery monitor as defined in claim 48 further including temperature sensing means for sensing the battery temperature and providing said processing means with a temperature sensor signal indicative of said battery temperature and wherein said processing means computes said gassing current responsive to said temperature sensor signal.

50. A battery monitor as defined in claim 47 wherein said memory means stores the last read said current sensor signal and, wherein said processing means determines if said last current sensor signal stored in said memory means is greater than said gassing current and computes an adjusted state of charge added to said battery since the last said computing time when said last current sensor signal stored in said memory means is greater than said gassing current.

51. A battery monitor as defined in claim 50 wherein said processing means computes the rated capacity of said battery and wherein said adjusted state of charge added to said battery is equal to the time since said last computing time multiplied by the difference between said last current and said gassing current divided by said rated capacity of said battery.

52. A battery monitor as defined in claim 44 wherein said processing means, when said battery is i recharge, further computes and stores in said memory means an integrated amp-hour state of charge of said battery by summing the last integrated amp-our state of charge of said battery stored in said memory means and said state of charge added to said battery.

53. A battery monitor as defined in claim 44 wherein said processing means computes said absolute state of charge of said battery, when said battery is in recharge, by summing the last said absolute state of charge of said battery stored in said memory means and said state of charge added to said battery 54. A battery monitor as defined in claim 53 wherein said processing means, when said battery is in recharge, computes said factor by determining the difference between the last said factor stored in said memory means and said state of charge added to aid battery.

55. A battery monitor as defined in claim 54 wherein said processing means computes said relative state of charge of said battery by determining the difference between said absolute state of charge of said battery and said factor.

56. A method of monitoring the operating parameters of a battery, said method comprising the steps of:
providing a voltage sensor;
sensing battery voltage and providing a voltage sensor signal indicative of said battery voltage;
providing a current sensor;
sensing battery current and providing a current sensor signal indicative of said battery current;
providing processing means coupled to said voltage sensor and said current sensor for reading said voltage sensor signal, for reading said current sensor signal, and for computing said operating parameters at spaced apart computing times;
providing memory means coupled to said processing means;
storing selected ones of the last computed said operating parameters in said memory means;
computing, when said battery is in discharge, responsive to said voltage sensor signal and said current sensor signal, a corrected battery voltage and computing from said corrected battery voltage relative state of charge of said battery;
computing a factor representing the difference between absolute state of charge of said battery ad said relative state of charge of sid battery and computing said absolute state of charge of said battery from a sum of said relative state of charge of said battery and said factor; and
providing output signals indicative of predetermined ones of said operating parameters 57. A method as defined in claim 56 comprising the further steps of providing a temperature sensor, sensing the battery temperature and providing said processing means with a temperature sensor signal indicative of said battery temperature, and computing said corrected battery voltage responsive to said temperature sensor signal.

58. A method as defined in claim 56 comprising the further steps of computing the rated capacity of said battery and the current capacity of said battery.

59. A method as defined in claim 58 comprising the further steps of storing the last read said current sensor signal and the last computed said factor of said battery in said memory means.

60. A method as defined in claim 59 comprising the further steps of computing said factor based upon said rated capacity of said battery, said current capacity of said battery, said stored last computed factor of said battery, the time since the last said computing time, and said stored last read current sensor signal.

61. A method as defined in claim 58 comprising the further steps of computing the capacity of said battery and storing said capacity of said battery in said memory means.

62. A method as defined in claim 61 comprising the further steps of computing said rated capacity of said battery based upon said stored capacity and computing said current capacity of said battery based upon said stored capacity and said current sensor signal.

63. A method as defined in claim 61 comprising the further steps of computing the integrated amp-hour state of charge of said battery and computing said capacity of said battery based upon said stored capacity, said absolute state of charge of said battery, said integrated amp-hour state of charge of said battery and the time since the last said computing time.

64. A method as defined in claim 58 comprising the further steps of providing a temperature sensor, sensing the battery temperature and providing said processing means with a temperature sensor signal indicative of said batter temperature and computing, responsive to said temperature sensor signal, a temperature compensation value for computing said rated capacity of said battery and said current capacity of said battery.

65. A method as defined in claim 56 comprising the further steps of storing said absolute state of charge of said battery and said factor in said memory means.

66. A method as defined in claim 65 comprising the further steps of limiting the value of said computed absolute state of charge of said battery and storing said limited absolute state of charge of said battery in said memory means.

67. A method as defined in claim 66 comprising the further steps of computing the step of charge used by said battery since the last said computing time.

68. A method as defined in claim 67 comprising the further steps of computing said limited absolute state of charge of said battery between the difference between the last stored said limited absolute state of charge value and the quantity of a first constant times the said state of charge used by said battery and the difference between the last stored said limited absolute state of charge value and the quantity of a second constant times the said state of charge used b y said battery.

69. A method as defined in claim 56 comprising the further steps of limiting the value of said computed relative state of charge of said battery and storing said limited relative state of charge value of said battery in said memory means.

70. A method as defined in claim 69 comprising the further steps of computing the state of charge used by said battery since the last said computing time.

71. A method as defined in claim 70 comprising the further steps of computing said computed limited relative state of charge of said battery between the difference between the last stored said limited relative state of charge value ad the quantity of a first constant times the said state of charge used by said battery and the difference between the last stored said limited relative state of charge value and the quantity of a second constant times the said state of charge used by said battery.

72. A method as defined in claim 56 comprising the further steps of computing at each of said computing times the relative state of charge of sid battery and providing an output signal indicative of said relative state of charge of said battery.

73. A method as defined in claim 56 comprising the further steps of computing at each of said computing times the absolute state of charge of said battery and providing an output signal indicative of the said absolute state of charge of said battery.

74. A method as defined in claim 56 comprising the further steps of computing at each of said computing times the fully charged output capacity of said battery at a given discharge current and providing an output signal indicative of said fully charged output capacity of said battery at said given discharge current.

75. A method as defined in claim 56 comprising the further steps of computing at each of said computing times the remaining output capacity of said battery at a given discharge current and providing an output signal indicative of said remaining output capacity.

76. A method as defined in claim 56 comprising the further steps of computing at each of said computing times the time to empty of said battery representing the time in which said battery will be fully discharged at a given discharge current and providing an output signal indicative of said time to empty.

77. A method as defined in claim 56 comprising the further steps of computing at each of said computing times the required amp-hours to fully recharge said battery and providing an output signal indicative of said amp-hours to fully recharge said battery.

78. A method as defined in claim 56 comprising the further steps of computing at each of said computing times the time to fully recharge said battery at a given recharge current and providing an output signal indicative of said time to fully recharge said battery.

79. A method as defined in claim 56 comprising the further steps of computing at each of said computing times a recommended recharge voltage for recharging said battery and providing an output signal indicative of said recommended recharge voltage.

80. A method as defined in claim 56 comprising the further steps of computing at each of said computing times a critical restart temperature of said battery and providing an output signal indicative of said critical restart temperature of said battery.

81. A method of monitoring the operating parameters of a battery, said method comprising the steps of:
providing a voltage sensor;
sensing battery voltage and providing a voltage sensor signal indicative of said battery voltage;
providing a current sensor;
sensing battery current and providing a current sensor signal indicative of said battery current;
providing processing means coupled to said voltage sensor and said current sensor for reading said voltage sensor signal, for reading said current sensor signal, and for computing said operating parameters at spaced apart computing times;
providing memory means coupled to sid processing means;
storing selected ones of the last computed said operating parameters in said memory means;
computing, when sid battery is at rest, responsive to said voltage sensor signal and said current sensor signal, the open circuit voltage and computing from said open circuit voltage the open circuit voltage state of charge of said battery;
determining if said open circuit voltage state of charge is accurate and setting absolute state of charge of said battery equal to the open circuit voltage state of charge of said battery after determining that said open circuit voltage state of charge is accurate; and
providing output signals indicative of predetermined ones of said operating parameters.

82. A method as defined in claim 81 comprising the further steps of providing timing means for determining the time in which said battery is at rest.

83. A method as defined in claim 82 comprising the further steps of resetting said timing means when said battery is not at rest.

84. A method as defined in claim 82 comprising the further steps of determining if said battery is at rest or not at rest responsive to said current sensor signal.

85. A method as defined in claim 84 comprising the further steps of, when said battery is not at rest, resetting said tie in which said battery is at rest.

86. A method as defined in claim 84 comprising the further steps of incrementing said timing means with the time since the last said computing time when said battery is at rest.

87. A method as defined in claim 82 comprising the further steps of determining if said battery has been at rest for a period of time greater than a first time period and determining that said open circuit voltage state of charge is accurate when said battery has been at rest for a period of time greater than said first time period.

88. A method as defined in claim 82 comprising the further steps of determining if said battery has been at rest for an intermediate time period greater than a second time period but less than a first time period.

89. A method as defined in claim 88 comprising the further steps of computing the absolute state of charge of said battery prior to determining if said battery has been at rest for said intermediate time period.

90. A method as defined in claim 89 comprising the further steps of computing the relative state of charge of said battery responsive to said absolute state o charge of said battery and the last computed factor stored in said memory means, wherein said factor represents the difference between said absolute state of charge of said battery and said relative state of charge of said battery.

91. A method as defined in claim 89 comprising the further steps determining, when said battery has been at rest for said intermediate time period, if the difference between said open circuit voltage state of charge and the absolute state of charge of said battery is less than a given magnitude and determining that said open circuit voltage state of charge is accurate when said difference is less than said given magnitude.

92. A method as defined in claim 91 comprising the further steps of advancing said timing mans to said first time period upon determining that said open circuit voltage state of charge is accurate.

93. A method as defined in claim 89 comprising the further steps of determining a given range of values wherein the difference between said given range of values and said absolute state of charge of said battery is less than a constant.

94. A method as defined in claim 93 comprising the further steps of computing said given range of values responsive to the time since the last computing time and the time since said battery was last not at rest.

95. A method as defined in claim 93 comprising the further steps of, when said battery has been at rest for said intermediate time period, setting said absolute state of charge of said battery equal to said open circuit voltage state of charge of said battery and adjusting said absolute state of charge of said battery to within said given range if said open circuit voltage state of charge of sid battery is outside of said given range.

96. A method as defined in claim 81 comprising the further steps of providing a temperature sensor, sensing the battery temperature and providing said processing means with a temperature sensing signal indicative of said batter temperature, and computing, responsive to said temperature sensor signal, said open circuit voltage of said battery.

97. A method as defined in claim 81 comprising the further steps of causing said processing means to compute the integrated amp-hour state of charge of said battery, to compute the capacity of said battery and to store the last computed said capacity of said battery and the last state of charge value.

98. A method as defined in claim 97 comprising the further steps of determining if the difference between said last state of charge value and said absolute state of charge is greater than a given amount and computing said capacity responsive to the last computed capacity, said absolute state of charge, said last state of charge value, and said integrated amp-hour state of charge of sid battery when said difference between said last state of charge value and said absolute state of charge is greater than said given amount.

99. A method of monitoring the operating parameters of a battery, sid method comprising the steps of:
providing a voltage sensor;
sensing battery voltage and providing a voltage sensor signal indicative of said battery voltage;
providing a current sensor;
sensing battery current and providing a current sensor signal indicative of said battery current;
providing processing means coupled to said voltage sensor and said current sensor for reading said voltage sensor signal, for reading said current sensor signal, and for computing said operating parameters at spaced apart computing times;
providing memory means coupled to said processing means;
storing selected ones of the last computed said operating parameters in said memory means;
determining, when said battery is in recharge, the state of charge added to said battery since the last said computing time, and computing at each of said computing times and storing in said memory means the absolute state of charge of said battery;
computing at each of said computing times and storing in said memory means a factor representing the difference between said absolute state of charge of said battery and relative state of charge of said battery; and
providing output signals indicative of predetermined ones of said operating parameters.

100. A method as defined in claim 99 comprising the further steps of computing said factor by determining, when said battery is in recharge, the difference between the last said factor stored in said memory means and the state of charge added to said battery.

101. A method as defined in claim 99 comprising the further steps of computing said relative state of charge of said battery responsive to sid absolute state of charge of said battery and the last computed factor stored in said memory means.

102. A method as defined in claim 99 comprising the further steps of computing, when said battery is in recharge, the gassing current of said battery representing the amount of recharge current which is not being used to recharge said battery.

103. A method as defined in claim 102 comprising the further steps of computing said gassing current responsive to said voltage sensor signal.

104. A method as defined in claim 103 comprising the further steps of providing a temperature sensor, sensing the battery temperature and providing said processing means with a temperature sensor signal indicative of said battery temperature and computing said gassing current responsive to said temperature sensor signal.

105. A method as defined in claim 102 comprising the further steps of storing in said memory means the last read said current sensor signal and determining if said last current sensor signal stored in said memory means is greater than said gassing current and computing an adjusted state of charge added to said battery since the last said computing time when said last current sensor signal stored in said memory means is greater than said gassing current.

106. A method as defined in claim 105 comprising the further steps of computing the rated capacity of said battery and wherein said adjusted state of charge added to said battery is equal to the time since said last computing time multiplied by the difference between said last current sensor signal and said gassing current divided by said rated capacity of said battery.

107. A method as defined in claim 99 comprising the further steps of, when sid battery is in recharge, computing and storing in said memory means the integrated amp-hour state of charge of sid battery by summing the last said integrated amp-hour state of charge of said battery stored in said memory means and said state of charge added to said battery.

108. A method as defined in claim 99 comprising the further steps of computing, when said battery is in recharge, said absolute state of charge of said battery by summing the last said absolute state of charge of said battery stored in said memory means and said state of charge added to said battery.

109. A method as defined in claim 108 comprising the further steps of computing, when said battery is in recharge, said factor by determining the difference between the last said factor stored in said memory means and said state of charge added to said battery.

110. A method as defined in claim 109 comprising the further steps of computing said relative state of charge of said battery by determining the difference between the said absolute state of charge of said battery and said factor.

111. A battery monitor for use with a batter, said battery monitor comprising:
processing means;
voltage sensor means coupled to said processing means for sensing battery voltage and providing a voltage sensor signal to said processing means;
current sensor means coupled to said processing means or sensing battery current and providing a current sensor signal to said processing means;
said processing means computing:

(1) the rated capacity of said battery;
(2) the current capacity of said battery;
(3) the state of charge used by said battery;
(4) a factor of said battery;
(5) the absolute state of charge of said battery; and
(6) the relative state of charge of said battery; and
output means coupled to sadi processing means for providing output signals including a signal indicative of said absolute state of charge of said battery.

112. A battery monitor as defined in claim 111 wherein said output signals include a signal indicative of said relative state of charge of said battery.

113. A battery monitor as defined in claim 111 further comprising temperature sensing means for sensing battery temperature and providing a temperature sensor signal to said processing means.

114. A battery monitor as defined in claim 111 wherein said processing means includes timing means for causing said processor to calculate said rated capacity of said battery; said current capacity of said battery; said state of charge used by said battery; said factor of said battery; said absolute state of charge of said battery; and said relative state of charge of said battery at spaced apart time intervals.

115. A battery monitor as defined in claim 111 further comprising timing means for sensing elapsed time and providing a timing signal to said processing means.

116. A battery monitor as defined in claim 111 wherein said processing means include storing means for storing the last computed said factor of said battery and the last computed said absolute state of charge of said battery.

117. A battery monitor as defined in claim 116 wherein said processing means determines whether said battery is in a recharge state or a discharge state responsive to said current sensor signal.

118. A battery monitor as defined in claim 117 wherein said processing means computes said absolute state of charge of said battery when said battery is in said recharge state by subtracting said state of charge used by said battery from said last computed absolute state of charge of said battery.

119. A battery monitor as defined in claim 118 wherein said processing means computes said state of charge used by said battery when said battery is in said recharge state by multiplying the difference between a gassing current, derived from said voltage sensor signal, and said current sensor signal, by the time since the last said computing time, and dividing by said rated capacity of said battery.

120. A battery monitor as defined in claim 119 wherein said processing means computes said absolute state of charge of said battery when said battery is in said recharge state by subtracting said state of charge used by said battery from said last computed absolute state of charge of said battery.

121. A battery monitor as defined in claim 120 wherein said processing means computes said relative state of charge of said battery when said battery is in said recharge state by subtracting said factor from said absolute state of charge of said battery, said factor being determined from said last computed factor and said state of charge used by said battery.

122. A battery monitor as defined in claim 118 wherein said processing means computes said relative state of charge of said battery when said battery is in said recharge state by subtracting said factor of said battery from said absolute state of charge of said battery, said factor of said battery being determined from: said last computed factor of said battery and the state of charge used by said battery.

123. A battery monitor as defined in claim 117 wherein said processing means computes said relative state of charge of said battery when said battery is in said discharge state responsive to said voltage sensor signal and said current sensor signal.

124. A battery monitor as defined in claim 123 wherein said processing means computes said absolute state of charge of said battery when said battery is in said discharge state by adding said factor of said battery to said relative state of charge of said battery, said factor being determined from: said rated capacity of said battery; said current capacity of said battery; said current sensor signal; said last computed factor; and said state of charge used by said battery.

125. A battery monitor as defined in claim 124 wherein said processing means limits the computed values for said relative state of charge and said absolute state of charge responsive to said last computed stored absolute state of charge of said battery, said factor of said battery, and said state of charge used by said battery and a constant.

126. A method of monitoring the absolute state of charge of a storage battery, said method comprising the steps of:
providing processing means;
providing voltage sensor means coupled to said processing means;
sensing the voltage of said battery and providing a voltage sensor signal to said processing means;
providing current sensor means coupled to said processing means;
sensing the battery current and providing a current sensor signal to said processing means;
computing by said processing means:
(1) the rated capacity of said battery;
(2) the current capacity of said battery;
(3) the state of charge used by said batter;
(4) a factor of said battery;
(5) the absolute state of charge of said battery; and
(6) the relative state of charge of said battery; and
providing an output signal indicative of said absolute state of charge of said battery.

127. A method as defined in claim 126 further comprising the step of providing an output signal indicative of said relative state of charge of said battery.

128. A method as defined in claim 126 further comprising the steps of providing temperature sensing means for sensing battery temperature and providing a temperature sensor signal to said processing means.

129. A method as defined in claim 126 further comprising the steps of calculating said rated capacity of said battery; said current capacity of said battery; said state of charge used by said battery; said factor of said battery; said absolute state of charge of said battery; and said relative state of charge of said battery at spaced apart time intervals.

130. A method as defined in claim 129 including the further step of storing the last computed said factor of said battery and the last computed said absolute state of charge of said battery.

131. A method as defined in claim 130 including the further step of determining whether said battery is in a recharge state or a discharge state responsive to said current sensor signal.

132. A method as defined in claim 131 including the further step of computing said absolute state of charge of said battery when said battery is in said recharge state by subtracting said state of charge used by said battery from said last computed absolute state of charge of said battery.

133. A method as defined in claim 132 including the further step of computing said state of charge used by said battery when said battery is in said recharge state by multiplying the difference between a gassing current, derived from said voltage sensor signal, and said current sensor signal, by the time since the last said computing time, and dividing by said rated capacity of said battery.

134. A method as defined in claim 133 including the further step of computing said absolute state of charge of said battery when said battery is in said recharge state by subtracting said state of charge used by said battery from said last computed absolute state of charge of said battery.

135. A method as defined in claim 134 including the further steps of computing said relative state of charge of said battery when said battery is in said recharge state by subtracting said factor from said absolute state of charge of said battery, said factor being determined from said last computed factor and said state of charge used by said battery.

136. A method as defined in claim 132 including the further step of computing said relative state of charge of said battery when said battery is in said recharge state by subtracting said factor of said battery from said absolute state of charge of said battery, said factor being determined from: said last computed factor of said battery; and the state of charge used by said battery.

137. A method as defined in claim 131 including the further step of computing said relative state of charge of said battery when said battery is in said discharge state based upon said voltage sensor signal and said current sensor signal.

138. A method as defined in claim 137 including the further step of computing said absolute state of charge of said battery when said battery is in said discharge state by adding said factor of said battery to said relative state of charge of said battery, said factor being determined from: said rated capacity of said battery; said current capacity of said battery; said last computed factor; said current sensor signal; and said state of charge used by said battery.

139. A method as defined in claim 138 including the further step of limiting the computed values for said relative state of charge and said absolute state of charge responsive to said last computed stored absolute state of charge of said battery, said factor of said battery, and said state of charge used by said battery and a constant.

* * * * *